(12) United States Patent
Behres et al.

(10) Patent No.: US 8,502,267 B2
(45) Date of Patent: Aug. 6, 2013

(54) OPTOELECTRONIC SEMICONDUCTOR COMPONENT

(75) Inventors: Alexander Behres, Pfatter (DE); Matthias Sabathil, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/142,885

(22) PCT Filed: Jan. 5, 2010

(86) PCT No.: PCT/EP2010/050039
§ 371 (c)(1), (2), (4) Date: Aug. 2, 2011

(87) PCT Pub. No.: WO2010/081754
PCT Pub. Date: Jul. 22, 2010

(65) Prior Publication Data
US 2011/0284918 A1 Nov. 24, 2011

(30) Foreign Application Priority Data
Jan. 16, 2009 (DE) .................. 10 2009 004 895

(51) Int. Cl.
*H01L 33/00* (2010.01)
(52) U.S. Cl.
USPC .................. 257/103; 257/E33.026
(58) Field of Classification Search
USPC ............ 257/94–103, E33.008, E33.026, 257/E33.027, E33.028, E33.043, E33.046, 257/E33.049
See application file for complete search history.

(56) References Cited

U.S. PATENT DOCUMENTS

| 5,802,090 | A | 9/1998 | York et al. |
|---|---|---|---|
| 6,472,680 | B1 | 10/2002 | Takayama et al. |
| 6,489,636 | B1 | 12/2002 | Goetz et al. |
| 2001/0002048 | A1 | 5/2001 | Koike et al. |
| 2002/0171091 | A1 | 11/2002 | Goetz et al. |
| 2004/0256611 | A1 | 12/2004 | Kim et al. |
| 2006/0006375 | A1* | 1/2006 | Ou et al. .................. 257/14 |
| 2007/0075327 | A1* | 4/2007 | Arai et al. .................. 257/103 |
| 2008/0111123 | A1 | 5/2008 | Tu et al. |
| 2008/0277686 | A1 | 11/2008 | Tsai |
| 2009/0116526 | A1* | 5/2009 | Hashimoto ............ 372/46.01 |

FOREIGN PATENT DOCUMENTS

| DE | 102 13 395 A1 | 10/2002 |
|---|---|---|
| DE | 11 2004 000 211 T5 | 12/2005 |
| DE | 10 2004 050 891 A1 | 4/2006 |
| EP | 1 396 878 A1 | 3/2004 |

(Continued)

OTHER PUBLICATIONS

A. Stein et al., "Room temperature InPSb/InAs and InPSb/InAs/InAsSb mid-infrared emitting diodes grown by MOVPE," *IEE Proc.—Optoelectron*, vol. 145, No. 5, Oct. 16, 1998, pp. 257-260.

(Continued)

*Primary Examiner* — Brook Kebede
(74) *Attorney, Agent, or Firm* — DLA Piper LLP (US)

(57) ABSTRACT

An optoelectronic semiconductor component includes an active layer that emits radiation, the active layer surrounded by cladding layers, wherein the cladding layers and/or the active layer include(s) an indium-containing phosphide compound semiconductor material and the phosphide compound semiconductor material contains at least one of elements Bi or Sb as an additional element of main group V.

16 Claims, 1 Drawing Sheet

(56) References Cited

FOREIGN PATENT DOCUMENTS

| | | |
|---|---|---|
| JP | 2001-326426 A | 11/2001 |
| WO | 2004/070900 A1 | 8/2004 |
| WO | 2005/029595 A1 | 3/2005 |
| WO | 2006/071328 A2 | 7/2006 |

OTHER PUBLICATIONS

J.K. Shurtleff et al., "Band-gap control of GaInP using Sb as a surfactant," Applied Physics Letters, vol. 75, No. 13, Sep. 27, 1999, pp. 1914-1916.

A. Joullié et al., "InAs(PSb)-based "W" quantum well laser diodes emitting near 3.3 μm," Applied Physics Letters, vol. 76, No. 18, May 1, 2000, pp. 2499-2501.

S.W. Jun et al., "Bi surfactant effectson ordering in GaInP grown by organometallic vapor-phase epitaxy," Applied Physics Letters, vol. 76, No. 19, May 8, 2000, pp. 2716-2718.

R.T.Lee et al, "Enhancement of compositional modulation in GaInP epilayers by the addition of surfactants during organometallic vapor phase epitaxy growth," Journal of Crystal Growth, vol. 223, No. 3, Dec. 1, 2001, pp. 490-502.

S.W. Jun et al., "Isoelectronic surfactant-induced surface step structure and correlation with ordering in GaInP," Journal of Crystal Growth, vol. 235, No. 1-4, Feb. 1, 2002, pp. 15-24.

* cited by examiner

OPTOELECTRONIC SEMICONDUCTOR COMPONENT

RELATED APPLICATIONS

This is a §371 of International Application No. PCT/EP2010/050039, with an international filing date of Jan. 5, 2010 (WO 2010/081754, published Jul. 22, 2010), which is based on German Patent Application No. 10 2009 004 895.2, filed Jan. 16, 2009, the subject matter of which is incorporated by reference.

TECHNICAL FIELD

This disclosure relates to an optoelectronic semiconductor component, in particular an LED, which comprises an indium-containing phosphide compound semiconductor material or a nitride compound semiconductor material.

BACKGROUND

During the epitaxial production of semiconductor layers for optoelectronic components which are based on InGaAlN or InGaAlP, undesirable effects often occur even under optimized process conditions.

In epitaxial semiconductor layers composed of InGaAlN, indium-rich regions, so-called "clusters," can form. High local strains arise in the region of the clusters, and can lead to formation of crystal defects which, as centers of non-radiative recombinations, reduce the efficiency of the LED. Even in the case of only a low degree of cluster formation, which does not lead to the formation of crystal defects, the efficiency of the LED can be reduced by an increased Auger recombination rate in the optically active layer due to a local charge carrier density increase in the region of the In clusters.

It has been established that the tendency toward formation of indium-rich regions can be reduced by the use of high growth temperatures, as a result of which, however, incorporation of indium into the epitaxially produced layers is also impaired. During epitaxial production of InAlGaN semiconductor layers by MOVPE (Metal Organic Vapor Phase Epitaxy), formation of clusters can also be reduced by a comparatively high reactor pressure of more than 800 mbar. However, this leads to a great increase in undesirable prior reactions of the process gases, which contain, for example, $NH_3$ or organometallic compounds such as TMGa, TMAl or TMIn, as a result of which formation of nanoparticles and, hence, defects in the semiconductor layer can occur. Reduction of such prior reactions by spatial and temporal separation of the feed of the source materials responsible for the prior reactions is also suitable only to a limited extent owing to associated restrictions of the growth parameters, in particular of the growth rate, and also more stringent requirements made of the epitaxy apparatus and high costs associated therewith.

Formation of indium clusters can also be reduced by using a high ratio of the group V material to the group III materials, in particular by a high supply of $NH_3$ in the gas phase. However, in this case, too, the prior reactions of the process gases increase and the costs for provision of $NH_3$ increase.

During epitaxial production of semiconductor layers for InGaAlP-based LEDs it can be observed that the material of the epitaxial layers deposits in an ordered fashion such that regions having a more or less distinct alternating arrangement of the group III atoms arise. This effect is also known as "ordering." These regions are separated from one another by grain boundaries which can reduce the efficiency in the active layer of the LED as centers of non-radiative recombinations.

In the case of LEDs, the active layer is generally surrounded by barrier layers which have a larger electronic band gap than the active layer and thus lead to charge carrier confinement in the active layer. It has been observed that, as a result of the ordering, a reduction of the band gap of the semiconductor material occurs which adversely affects the function of the barrier layers and in this way can lead to an increase in leakage currents and thus to a reduction of efficiency of the LED.

The ordering can be at least partly reduced by using high growth temperatures, but an undesired diffusion of dopants in the epitaxial layers is also intensified as a result.

It could therefore be helpful to provide an optoelectronic semiconductor component based on an indium-containing phosphide compound semiconductor or nitride compound semiconductor which has an increased efficiency. In particular, it could be helpful to reduce the above-described disadvantageous effects which adversely affect efficiency.

SUMMARY

We provide an optoelectronic semiconductor component including an active layer that emits radiation, the active layer surrounded by cladding layers, wherein the cladding layers and/or the active layer includes an indium-containing phosphide compound semiconductor material and the phosphide compound semiconductor material contains at least one of elements Bi or Sb as an additional telement of the main group V.

We also provide an optoelectronic semiconductor component including an active layer including an indium-containing nitride compound semiconductor material, wherein the nitride compound semiconductor material of the active layers contains at least one of elements Ab, Bi or Sb as an additional element of main group V.

DETAILED DESCRIPTION

Figure 1:
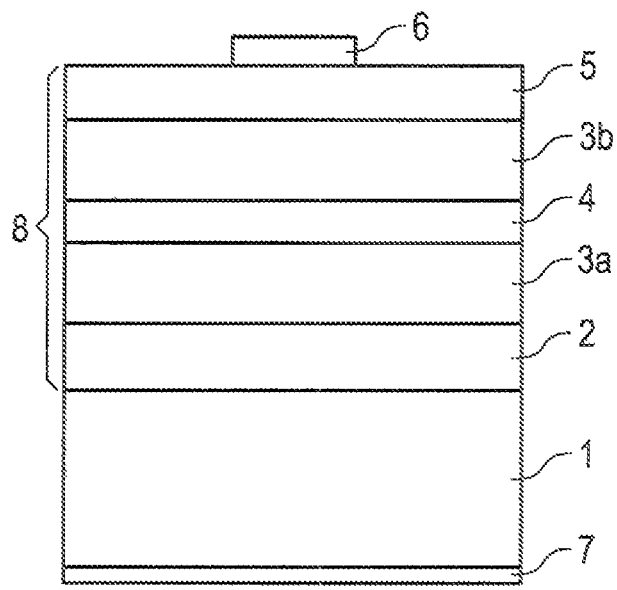
FIG. 1 shows a schematic illustration of a cross section through an optoelectronic semiconductor component in accordance with a first example.

We discovered that disadvantageous effects during epitaxial production of semiconductor layers composed of an indium-containing phosphide compound semiconductor material or nitride compound semiconductor material can be reduced by the semiconductor material containing at least one additional element of main group V alongside P or N. In particular by adding As, Bi and/or Sb in the case of a nitride compound semiconductor material or adding Bi and/or Sb in the case of a phosphide compound semiconductor material, it is possible to increase the efficiency of the optoelectronic component.

The optoelectronic semiconductor component may comprise an active layer suitable for emitting radiation, the active layer being surrounded by cladding layers, wherein the cladding layers and/or the active layer comprise(s) an indium-containing phosphide compound semiconductor material and the phosphide compound semiconductor material contains at least one of the elements Bi or Sb as an additional element of main group V.

The fact that the phosphide compound semiconductor material contains Bi or Sb as an additional element of main group V reduces ordering, that is to say formation of ordered regions in the semiconductor layers which contain in an alternating sequence predominantly indium-containing layers and Al- or Ga-containing layers. Reduction of ordering also results in reduction of the number of grain boundaries in the phosphide compound semiconductor material which, as centers of non-radiative recombinations, could reduce the efficiency of the radiation-emitting optoelectronic semiconductor component. At the same time, the band gap of the compound semiconductor increases for the same stoichiometric composition.

We believe, inter alia, that the effect of reducing ordering is based on the fact that heavy atoms Sb or Bi reduce mobility of the atoms on the surface of the semiconductor layer during epitaxial growth. Since the mass of the additional atom of main group V is of importance for this mechanism, addition of the heavier element Bi is even more effective than addition of Sb. Furthermore, the additional atoms can alter the electronic structure of the surface such that ordering decreases.

Preferably, the cladding layers surrounding the active layer contain Bi and/or Sb as an additional element of main group V. The cladding layers advantageously have a larger electronic band gap than the active layer. In this way, the cladding layers bring about confinement of the charge carriers in the active layer, as a result of which efficiency of the radiation-emitting optoelectronic component increases. We found that addition of Bi and/or Sb as an additional element of main group V not only reduces ordering, but also leads to an increase in electronic band gap of the phosphide compound semiconductor material. The effect of the cladding layers is intensified by such an increase in the band gap and, in this way, increases efficiency of the optoelectronic semiconductor component, which can be, in particular, an LED, a semiconductor laser or a solar cell.

Preferably, the additional element of main group V Bi and/or Sb is incorporated into the cladding layers, but not into the active layer. Consequently, the increase in the electronic band gap occurs only in the cladding layers, as a result of which the difference in electronic band gaps between the active layer and the cladding layers increases and, consequently, the charge carrier confinement in the active layer is improved further.

Alternatively, however, it is also possible for both the cladding layers and the active layer to contain Bi and/or Sb, or for only the active layer to contain Bi and/or Sb, since reduction of ordering in the phosphide compound semiconductor material of the active layer also already increases efficiency of the optoelectronic component by reducing grain boundaries.

The phosphide compound semiconductor material of the cladding layers and/or of the active layer can have, in particular, the composition $In_xGa_yAl_{1-x-y}P_{1-z}Sb_z$ or $In_xGa_yAl_{1-x-y}P_{1-z}Bi_z$ where $0<x\leq1$, $0\leq y<1$, $x+y\leq1$ and $0<z<1$.

Furthermore, the phosphide compound semiconductor material can also contain both elements Sb and Bi. The phosphide compound semiconductor material therefore has the composition $In_xGa_yAl_{1-x-y}P_{1-z}(Sb_uBi_{1-u})_z$ where $0<x\leq1$, $0\leq y<1$, $x+y\leq1$, $0\leq u\leq1$ and $0<z<1$.

Advantageously, the phosphide compound semiconductor material contains both In, Ga and Al as group III elements. In this case, therefore, $x>0$, $y>0$ and $x+y<1$ hold true. The phosphide compound semiconductor material is therefore preferably a quinternary semiconductor material.

Addition of at least one additional element from main group V advantageously does not give rise to any additional doping of the semiconductor material since Sb or Bi is incorporated into the crystal lattice isoelectronically at the group V site.

We found that even very small quantities of the group V element Sb or Bi suffice to reduce ordering. Preferably, the following holds true for the proportion z of the at least one additional group V element in the phosphide compound semiconductor material: $0<z\leq0.03$. The following preferably holds true: $0<z\leq0.02$, particularly preferably even $0<z\leq0.005$. By virtue of the fact that only a very small quantity of the additional element of main group V is added to the phosphide compound semiconductor material, the structural and electronic properties of the semiconductor material are influenced only insignificantly apart from the advantageous reduction of ordering and increase in band gap.

The incorporation of an additional element of main group V is particularly advantageous if the phosphide compound semiconductor material has an indium proportion of approximately 0.5 since the tendency of the semiconductor material toward ordering is the greatest in the case of an indium proportion of approximately 0.5. The indium proportion in the semiconductor material is advantageously $0.3\leq x\leq0.7$, preferably $0.4\leq x\leq0.6$, and particularly preferably $0.45\leq x\leq0.55$.

An optoelectronic semiconductor component may contain an active layer comprising an indium-containing nitride compound semiconductor material, wherein the nitride compound semiconductor material of the active layer contains at least one of the elements As, Bi or Sb as an additional element of main group V.

In particular, it has been found that formation of indium clusters is reduced by addition of at least one of the elements As, Bi or Sb during production of the nitride compound semiconductor material.

The formation of crystal defects which act as centers of non-radiative recombinations in the active layer is reduced by reduction of formation of indium clusters. In this way, efficiency of the optoelectronic semiconductor component is improved, where the optoelectronic semiconductor component can be, in particular, an LED, a semiconductor laser or a solar cell.

We believe that the effect of reducing formation of indium clusters is based on the fact that the comparatively heavy atoms As, Sb or Bi in comparison with N reduce the migration length of the indium compounds on the crystal surface during the epitaxial growth, in particular by impacts. Heavy atoms on the surface appear to reduce mobility of the indium compounds such that the indium atoms are incorporated into the crystal lattice in the vicinity of the site at which they impinge on the surface, before they can combine with other indium atoms to form clusters.

Since the mass of the additional atom of main group V plays a part in this mechanism, addition of the heavier elements Sb or Bi is even more effective than addition of As. Addition of Bi, which is even heavier than Sb, is particularly preferred.

Formation of indium clusters is reduced in this way without necessitating an increased growth temperature or an increased VIII ratio with the disadvantageous effects associated therewith. Furthermore, it is advantageous that the elements As, Sb or Bi are incorporated into the crystal lattice isoelectronically at the group V site and therefore do not produce any additional doping.

During epitaxial production of the semiconductor layers by MOVPE, the additional element As, Sb or Bi can be fed to the reactor in the form of an additional process gas such as, for example, TESb or AsH$_3$. Alternatively, As, Sb or Bi can also be fed as a targeted impurity in process gases such as TMGa or TMAl.

The nitride compound semiconductor material preferably has the composition $In_xGa_yAl_{1-x-y}N_{1-z}Sb_z$, $In_xGa_yAl_{1-x-y}N_{1-z}Sb_z$ or $In_xGa_yAl_{1-x-y}N_{1-z}Bi_z$, in each case where $0<x\leq1$, $0\leq y\leq1$, $x+y\leq1$ and $0<z<1$.

Furthermore, the nitride compound semiconductor material can also contain two or three of the elements As, Sb or Bi. The nitride compound semiconductor material therefore has the composition $In_xGa_yAl_{1-x-y}N_{1-z}(As_uSb_vBi_{1-u-v})_z$ where $0<x\leq1$, $0\leq y<1$, $x+y\leq1$, $0\leq u\leq1$, $0\leq v\leq1$, $u+v\leq1$ and $0<z<1$.

The nitride compound semiconductor material can comprise, in particular, all three group III elements In, Ga and Al, that is to say that x>0, y>0 and 1-x-y>0 hold true. The nitride compound semiconductor material is preferably a quinternary semiconductor material in this case.

We found that even very small quantities of the group V element As, Sb or Bi suffice to reduce formation of indium clusters. Preferably, the following holds true for the proportion z of the at least one additional group V element in the nitride compound semiconductor material: $0<z\leq0.03$. The following preferably holds true: $0<z\leq0.02$, particularly preferably even $0<z\leq0.005$. By virtue of the fact that only a very small quantity of the additional element of main group V is added to the nitride compound semiconductor material, structural and electronic properties of the semiconductor material are influenced only insignificantly apart from the advantageous reduction of formation of indium clusters.

Incorporation of an additional element of main group V is particularly advantageous if the nitride compound semiconductor material has a relatively large content of indium since, as the indium content increases, the risk of formation of indium clusters also rises. The indium proportion in the semiconductor material is advantageously $x\geq0.1$, preferably $x\geq0.2$, and particularly preferably even $x\geq0.3$. Such indium contents, which are comparatively high for a nitride compound semiconductor material, are required, in particular, for producing green-emitting optoelectronic semiconductor components. Since the band gap of the semiconductor material decreases as the indium content increases, the wavelength of the radiation emitted by the active layer shifts toward higher wavelengths as the indium content increases.

Consequently, given a comparatively high indium content, instead of the nitride compound semiconductor components usually emitting in the ultraviolet or blue spectral range, it is also possible to realize efficient green-emitting components.

This is explained in greater detail below on the basis of two examples in connection with FIGS. 1 and 2.

Identical or identically acting constituent parts are provided with the same reference symbols in the figures. The constituent parts illustrated and also the size relationships of the constituent parts among one another should not be regarded as true to scale.

The optoelectronic semiconductor component illustrated in FIG. 1 is an LED. The LED has an epitaxial layer sequence 8 applied to a substrate 1, which epitaxial layer sequence can be produced by MOVPE, in particular.

The epitaxial layer sequence 8 contains a radiation-emitting active layer 4. The active layer can be, for example, an individual layer, as a double heterostructure, as a single quantum well structure or multiple quantum well structure. In particular, the designation quantum well structure does not include any indication about the dimensionality of the quantization. It therefore encompasses, inter alia, quantum wells, quantum wires and quantum dots and any combination of these structures.

The active layer 4 is arranged between a first cladding layer 3a and a second cladding layer 3b. The cladding layers 3a, 3b advantageously have a larger electronic band gap than the active layer 4, as a result of which charge carrier confinement is brought about in the active layer 4. The cladding layers 3a, 3b can also be constructed as a layer sequence made from a plurality of partial layers.

One or a plurality of further semiconductor layers 2 can be arranged between the substrate 1 and the first cladding layer 3a. Furthermore, the second cladding layer 3b can also be succeeded by one or a plurality of further semiconductor layers 5, for example a current spreading or contact layer. By way of example, the semiconductor layers 2, 3a arranged between the substrate 1 and the active layer 4 are n-doped and the semiconductor layers 3b, 5 arranged on that side of the active layer 4 which is remote from the substrate 1 are p-doped. The substrate 1 can be a GaAs substrate, for example.

To make electrical contact with the LED, by way of example, a first contact metallization 7 is applied to the rear side of the substrate 1 remote from the epitaxial layer sequence 8, and a second contact metallization 6 is applied to that surface of the epitaxial layer sequence 8 which is remote from the substrate.

The cladding layers 3a, 3b and/or the active layer 4 contain a phosphide compound semiconductor material containing indium wherein the phosphide compound semiconductor material comprises, in addition to P, at least one of the elements Sb or Bi as additional element of main group V.

Preferably, the phosphide compound semiconductor material of the cladding layers 3a, 3b and/or of the active layer 4 has the composition $In_xGa_yAl_{1-x-y}P_{1-z}Sb_z$ or $In_xGa_yAl_{1-x-y}P_{1-z}Bi_z$, in each case where $0<x\leq1$, $0\leq y<1$, $x+y\leq1$ and $0<z<1$. Furthermore, the phosphide compound semiconductor material can also comprise both additional group V elements Sb and Bi. The phosphide compound semiconductor material therefore has the composition $In_xGa_yAl_{1-x-y}P_{1-z}(Sb_uBi_{1-u})_z$ where $0<x\leq1$, $0\leq y<1$, $x+y\leq1$, $0\leq u\leq1$ and $0<z<1$.

Addition of Sb and/or Bi as an additional element of main group V reduces ordering in the phosphide compound semiconductor as a result of which formation of grain boundaries in the semiconductor material is also reduced. Since grain boundaries between ordered regions of the semiconductor material act as centers for non-radiative recombinations of charge carriers, efficiency of the LED is increased by reduction of the grain boundaries. This is the case particularly when the active layer 4 contains Sb or Bi as additional element.

Further preferably, the additional element Sb and/or Bi is contained in the phosphide compound semiconductor material of the cladding layers 3a, 3b. We found that addition of Sb and/or Bi increases the electronic band gap of the phosphide compound semiconductor material. The effect of the cladding layers with regard to charge carrier confinement in the active layer 4 is intensified in this way.

The advantageous effect of the additional element Sb and/or Bi with regard to reducing ordering and increasing the band gap of the phosphide compound semiconductor material already occurs with comparatively small quantities of the additional material of main group V. The proportion z of the element Sb and/or Bi in the phosphide compound semiconductor material is advantageously $z\leq0.03$, preferably $z\leq0.02$, and particularly preferably $z\leq0.005$.

Incorporation of the additional element Sb and/or Bi is advantageous particularly when the phosphide compound semiconductor material has an indium proportion of approximately 0.5 since the tendency of the semiconductor material toward ordering is the greatest in the case of an indium proportion of approximately 0.5. The indium proportion in the semiconductor material is advantageously $0.3 \leq x \leq 0.7$, preferably $0.4 \leq x \leq 0.6$, and particularly preferably $0.45 \leq x \leq 0.55$.

Figure 2:
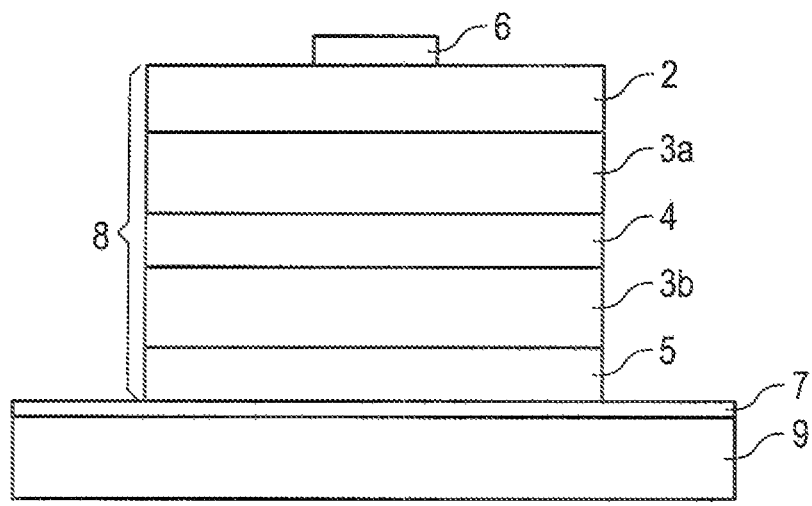
FIG. 2 shows a schematic illustration of a cross section through an optoelectronic semiconductor component in accordance with a second example.

The optoelectronic semiconductor component schematically illustrated in cross section in FIG. 2 is a thin-film LED. A thin-film LED should be understood to mean an LED in which the original growth substrate has been stripped away from the epitaxial layer sequence 8 and the epitaxial layer sequence 8 has been mounted onto a carrier 9 at the side opposite the original growth substrate.

Proceeding from the carrier 9, the epitaxial layer sequence 8 has, for example, one or a plurality of p-doped layers 5, a p-doped second cladding layer 3b, an active layer 4, an n-doped first cladding layer 3a and one or a plurality of n-doped layers 2. The construction of the epitaxial layer sequence 8 therefore corresponds to the construction illustrated in FIG. 1, but with an opposite order of semiconductor layers. Thus, in the case of the thin-film LED, typically the p-doped semiconductor layers 3b, 5 face the carrier 9 and the n-doped layers 2, 3a are remote from the carrier 9. As a result of stripping-away of the original growth substrate from the epitaxial layer sequence 8 and application to the carrier 9, which is preferably provided with a reflective contact layer 7, efficiency of the LED increases and the growth substrate can advantageously be reused. This is advantageous particularly for comparatively expensive growth substrates for nitride compound semiconductors, for example, substrates composed of GaN or sapphire.

As in the case of the example described in FIG. 1, the active layer 4 of the LED is arranged between a first cladding layer 3a and a second cladding layer 3b. The active layer 4 contains an indium-containing nitride compound semiconductor material. The nitride compound semiconductor material contains, in addition to N, at least one of the materials As, Sb or Bi as additional element of main group V.

The nitride compound semiconductor material of the active layer 4 can have, in particular, the composition $In_xGa_yAl_{1-x-y}N_{1-z}As_z$, $In_xGa_yAl_{1-x-y}N_{1-z}Sb_z$ or $In_xGa_yAl_{1-x-y}N_{1-z}Bi_z$ where $0 < x \leq 1, 0 \leq y < 1, x+y \leq 1$ and $0 < z < 1$.

A compound comprising two or three of the additional elements As, Sb or Bi is also possible. The nitride compound semiconductor material therefore has the composition $In_xGa_yAl_{1-x-y}N_{1-z}(As_uSb_vBi_{1-u-v})_z$ where $0 < x \leq 1, 0 \leq y < 1, x+y \leq 1, 0 \leq u \leq 1, 0 \leq v \leq 1, u+v \leq 1$ and $0 < z < 1$.

The at least one additional element As, Bi or Sb advantageously reduces formation of indium clusters in the nitride compound semiconductor material of the active layer 4. Reduction of the indium clusters has the advantage that formation of crystal defects which, as centers of non-radiative recombinations, could reduce efficiency of the LED, is reduced. A local charge carrier density increase in the region of indium clusters, which could bring about an increased non-radiative Auger recombination rate, is also reduced in this way.

Electrical contact can be made with the thin-film LED, for example, with a contact metallization 7 on the carrier 9, the contact metallization preferably being reflective to the emitted radiation of the LED, and a further contact metallization 6 on that surface of the epitaxial layer sequence 8 which is remote from the carrier 9.

The addition of As, Sb or Bi as additional element of main group V to the nitride compound semiconductor material is advantageous particularly when the radiation-emitting active layer 4 has a comparatively high indium content. The indium content of the active layer 4 can be, in particular, $x \geq 0.1$, particularly preferably $x \geq 0.2$, or even $x \geq 0.3$.

Even small quantities of one of the elements As, Bi or Sb in the nitride compound semiconductor material suffice for reducing formation of indium clusters. The proportion Z of the additional element is advantageously $0 < z \leq 0.03$, preferably $0 < z \leq 0.02$, and particularly preferably $0 < z \leq 0.005$. The electronic properties of the nitride compound semiconductor material are advantageously only influenced slightly in the case of such small quantities of the additional element.

It goes without saying that not just the LED comprising the epitaxial layer sequence 8 based on a nitride compound semiconductor material can be realized as a thin-film LED without a growth substrate, in accordance with the second example, but also the epitaxial layer sequence 8 based on a phosphide compound semiconductor material in the first example described above. Likewise, the epitaxial layer sequence 8 based on a nitride compound semiconductor material in the second example can alternatively be realized as an LED with a growth substrate, as illustrated in FIG. 1.

Our components are not restricted by the description on the basis of the examples. Rather, this disclosure encompasses any novel feature and also any combination of features, which in particular includes any combination of features in the appended claims, even if the feature or the combination itself is not explicitly specified in the claims or examples.

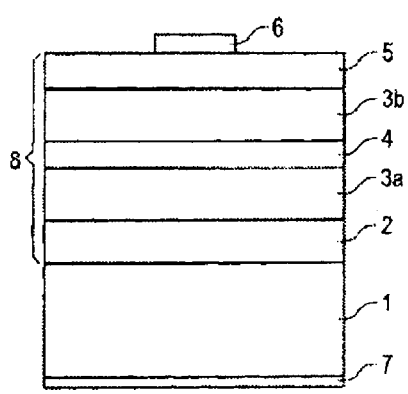
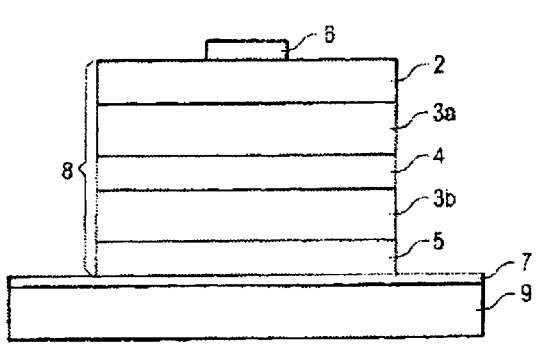

The invention claimed is:

1. An optoelectronic semiconductor component comprising:
    an active layer that emits radiation, said active layer surrounded by cladding layers,
    wherein the cladding layers and/or the active layer comprise(s) an indium-containing phosphide compound semiconductor material, the phosphide compound semiconductor material contains at least one of elements Bi or Sb as an additional element of main group V, and the phosphide compound semiconductor material has a composition $In_xGa_yAl_{1-x-y}P_{1-z}Sb_z$ where $0 < x \leq 1, 0 \leq y \leq 1, x+y \leq 1$ and $0 < z < 1$.

2. The optoelectronic semiconductor component according to claim 1, wherein the cladding layers contain Bi and/or Sb.

3. The optoelectronic semiconductor component according to claim 1, wherein the active layer contains neither Bi nor Sb.

4. The optoelectronic semiconductor component according claim 1, wherein the active layer contains Bi and/or Sb.

5. The optoelectronic semiconductor component according to claim 1, wherein $0 < z \leq 0.03$.

6. The optoelectronic semiconductor component according to claim 1, wherein $0.3 \leq x \leq 0.7$.

7. An optoelectronic semiconductor component comprising:
    an active layer comprising an indium-containing nitride compound semiconductor material,
    wherein the nitride compound semiconductor material of the active layer contains at least one of elements As, Bi or Sb as an additional element of main group V, and the nitride compound semiconductor material has a composition $In_xGa_yAl_{1-x-y}N_{1-z}As_z$, $In_xGa_yAl_{1-x-y}N_{1-z}Sb_z$ or $In_xGa_yAl_{1-x-y}N_{1-z}Bi_z$, where $0 < x \leq 1, 0 \leq y \leq 1, x+y \leq 1$ and $0 < z < 1$.

8. The optoelectronic semiconductor component according to claim 7, wherein $0<z\leq0.03$.

9. The optoelectronic semiconductor component according to claim 7, wherein $0<z\leq0.005$.

10. The optoelectronic semiconductor component according to claim 7, wherein $x\geq0.1$.

11. The optoelectronic semiconductor component according to claim 7, wherein $x\geq0.2$.

12. The optoelectronic semiconductor component according to claim 7, wherein $x\geq0.3$.

13. The optoelectronic semiconductor component according to claim 7, wherein $x\geq0.1$ and $0<z\leq0.03$.

14. The optoelectronic semiconductor component according to claim 7, wherein $x\geq0.3$ and $0<z\leq0.005$.

15. An optoelectronic semiconductor component comprising:
   an active layer that emits radiation, said active layer surrounded by cladding layers,
   wherein the cladding layers and/or the active layer comprise(s) an indium-containing phosphide compound semiconductor material, the phosphide compound semiconductor material contains at least one of elements Bi or Sb as an additional element of main group V, and the phosphide compound semiconductor material has a composition $In_xGa_yAl_{1-x-y}P_{1-z}Bi_z$ where $0<x\leq1$, $0\leq y\leq1$, $x+y\leq1$ and $0<z<1$.

16. The optoelectronic semiconductor component according to claim 15, wherein $0<z\leq0.03$.

* * * * *

UNITED STATES PATENT AND TRADEMARK OFFICE
CERTIFICATE OF CORRECTION

PATENT NO. : 8,502,267 B2  Page 1 of 1
APPLICATION NO. : 13/142885
DATED : August 6, 2013
INVENTOR(S) : Behres et al.

It is certified that error appears in the above-identified patent and that said Letters Patent is hereby corrected as shown below:

In the Claims

In Column 9

After Claim 16, please insert: -- 17. The optoelectronic semiconductor component according claim 15, wherein $0.3 \leq x \leq 0.7$. --.

Signed and Sealed this
Twenty-second Day of October, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,502,267 B2
APPLICATION NO. : 13/142885
DATED : August 6, 2013
INVENTOR(S) : Behres et al.

It is certified that error appears in the above-identified patent and that said Letters Patent is hereby corrected as shown below:

Delete the title page and substitute therefore the attached title page showing the corrected number of claims in patent.

In the Claims

In Column 9, line 29,

After Claim 16, please insert: -- 17. The optoelectronic semiconductor component according claim 15, wherein $0.3 \leq x \leq 0.7$. --.

This certificate supersedes the Certificate of Correction issued October 22, 2013.

Signed and Sealed this
Twelfth Day of November, 2013

Teresa Stanek Rea
*Deputy Director of the United States Patent and Trademark Office*

(12) United States Patent
Behres et al.

(10) Patent No.: US 8,502,267 B2
(45) Date of Patent: Aug. 6, 2013

(54) OPTOELECTRONIC SEMICONDUCTOR COMPONENT

(75) Inventors: Alexander Behres, Pfatter (DE); Matthias Sabathil, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/142,885

(22) PCT Filed: Jan. 5, 2010

(86) PCT No.: PCT/EP2010/050039
§ 371 (c)(1),
(2), (4) Date: Aug. 2, 2011

(87) PCT Pub. No.: WO2010/081754
PCT Pub. Date: Jul. 22, 2010

(65) Prior Publication Data
US 2011/0284918 A1 Nov. 24, 2011

(30) Foreign Application Priority Data
Jan. 16, 2009 (DE) .................... 10 2009 004 895

(51) Int. Cl.
*H01L 33/00* (2010.01)
(52) U.S. Cl.
USPC .................... 257/103; 257/E33.026
(58) Field of Classification Search
USPC ............ 257/94–103, E33.008, E33.026, 257/E33.027, E33.028, E33.043, E33.046, 257/E33.049
See application file for complete search history.

(56) References Cited

U.S. PATENT DOCUMENTS

| | | |
|---|---|---|
| 5,802,090 A | 9/1998 | York et al. |
| 6,472,680 B1 | 10/2002 | Takayama et al. |
| 6,489,636 B1 | 12/2002 | Goetz et al. |
| 2001/0002048 A1 | 5/2001 | Koike et al. |
| 2002/0171091 A1 | 11/2002 | Goetz et al. |
| 2004/0256611 A1 | 12/2004 | Kim et al. |
| 2006/0006375 A1 * | 1/2006 | Ou et al. ............ 257/14 |
| 2007/0075327 A1 * | 4/2007 | Arai et al. ........... 257/103 |
| 2008/0111123 A1 | 5/2008 | Tu et al. |
| 2008/0277686 A1 | 11/2008 | Tsai |
| 2009/0116526 A1 * | 5/2009 | Hashimoto ........ 372/46.01 |

FOREIGN PATENT DOCUMENTS

| | | |
|---|---|---|
| DE | 102 13 395 A1 | 10/2002 |
| DE | 11 2004 000 211 T5 | 12/2005 |
| DE | 10 2004 050 891 A1 | 4/2006 |
| EP | 1 396 878 A1 | 3/2004 |

(Continued)

OTHER PUBLICATIONS

A. Stein et al., "Room temperature InPSb/InAs and InPSb/InAs/InAsSb mid-infrared emitting diodes grown by MOVPE," *IEE Proc.—Optoelectron*, vol. 145, No. 5, Oct. 16, 1998, pp. 257-260.

(Continued)

*Primary Examiner* — Brook Kebede
(74) *Attorney, Agent, or Firm* - DLA Piper LLP (US)

(57) ABSTRACT

An optoelectronic semiconductor component includes an active layer that emits radiation, the active layer surrounded by cladding layers, wherein the cladding layers and/or the active layer include(s) an indium-containing phosphide compound semiconductor material and the phosphide compound semiconductor material contains at least one of elements Bi or Sb as an additional element of main group V.

17 Claims, 1 Drawing Sheets

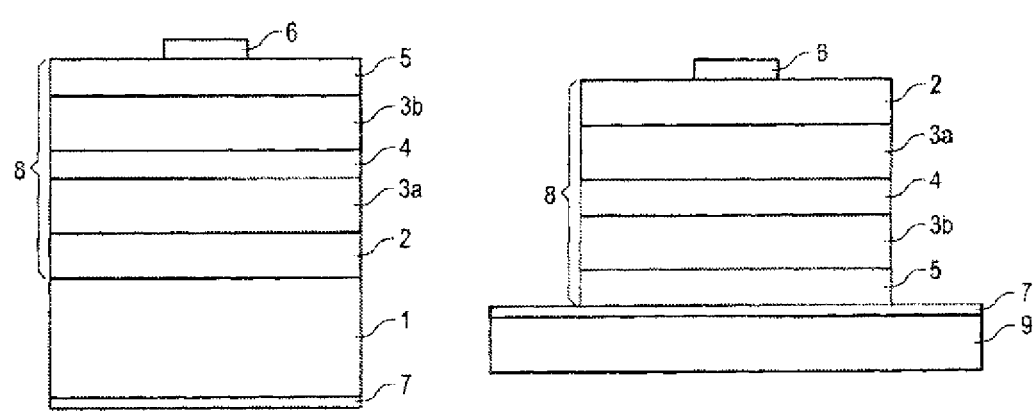

UNITED STATES PATENT AND TRADEMARK OFFICE
CERTIFICATE OF CORRECTION

| | |
|---|---|
| PATENT NO. | : 8,502,267 B2 |
| APPLICATION NO. | : 13/142885 |
| DATED | : August 6, 2013 |
| INVENTOR(S) | : Behres et al. |

Page 1 of 2

It is certified that error appears in the above-identified patent and that said Letters Patent is hereby corrected as shown below:

Delete the title page and substitute therefore the attached title page showing the corrected number of claims in patent.

In the Claims

In Column 9, line 29,

After Claim 16, please insert: -- 17. The optoelectronic semiconductor component according to claim 15, wherein $0.3 \leq x \leq 0.7$. --.

This certificate supersedes the Certificates of Correction issued October 22, 2013 and November 12, 2013.

Signed and Sealed this
Eleventh Day of February, 2014

Michelle K. Lee
*Deputy Director of the United States Patent and Trademark Office*

CERTIFICATE OF CORRECTION (continued)

(12) United States Patent
Behres et al.

(10) Patent No.: US 8,502,267 B2
(45) Date of Patent: Aug. 6, 2013

(54) OPTOELECTRONIC SEMICONDUCTOR COMPONENT

(75) Inventors: Alexander Behres, Pfatter (DE); Matthias Sabathil, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 13/142,885

(22) PCT Filed: Jan. 5, 2010

(86) PCT No.: PCT/EP2010/050039
§ 371 (c)(1),
(2), (4) Date: Aug. 2, 2011

(87) PCT Pub. No.: WO2010/081754
PCT Pub. Date: Jul. 22, 2010

(65) Prior Publication Data
US 2011/0284918 A1  Nov. 24, 2011

(30) Foreign Application Priority Data
Jan. 16, 2009  (DE) .................. 10 2009 004 895

(51) Int. Cl.
*H01L 33/00*  (2010.01)
(52) U.S. Cl.
USPC .................. 257/103; 257/E33.026
(58) Field of Classification Search
USPC .................. 257/94–103, E33.008, E33.026, 257/E33.027, E33.028, E33.043, E33.046, 257/E33.049
See application file for complete search history.

(56) References Cited

U.S. PATENT DOCUMENTS

| | | |
|---|---|---|
| 5,802,090 A | 9/1998 | York et al. |
| 6,472,680 B1 | 10/2002 | Takayama et al. |
| 6,489,636 B1 | 12/2002 | Goetz et al. |
| 2001/0002048 A1 | 5/2001 | Koike et al. |
| 2002/0171091 A1 | 11/2002 | Goetz et al. |
| 2004/0256611 A1 | 12/2004 | Kim et al. |
| 2006/0006375 A1* | 1/2006 | Ou et al. .......... 257/14 |
| 2007/0075327 A1* | 4/2007 | Arai et al. .......... 257/103 |
| 2008/0111123 A1 | 5/2008 | Tu et al. |
| 2008/0277686 A1 | 11/2008 | Tsai |
| 2009/0116526 A1* | 5/2009 | Hashimoto .......... 372/46.01 |

FOREIGN PATENT DOCUMENTS

| | | |
|---|---|---|
| DE | 102 13 395 A1 | 10/2002 |
| DE | 11 2004 000 211 T5 | 12/2005 |
| DE | 10 2004 050 891 A1 | 4/2006 |
| EP | 1 396 878 A1 | 3/2004 |

(Continued)

OTHER PUBLICATIONS

A. Stein et al., "Room temperature InPSb/InAs and InPSb:InAs/InAsSb mid-infrared emitting diodes grown by MOVPE," *IEE Proc.—Optoelectron*, vol. 145, No. 5, Oct. 16, 1998, pp. 257-260.

(Continued)

*Primary Examiner* — Brook Kebede
(74) *Attorney, Agent, or Firm* - DLA Piper LLP (US)

(57) ABSTRACT

An optoelectronic semiconductor component includes an active layer that emits radiation, the active layer surrounded by cladding layers, wherein the cladding layers and/or the active layer include(s) an indium-containing phosphide compound semiconductor material and the phosphide compound semiconductor material contains at least one of elements Bi or Sb as an additional element of main group V.

17 Claims, 1 Drawing Sheets